United States Patent [19]
Toro

[11] Patent Number: 5,143,592
[45] Date of Patent: Sep. 1, 1992

[54] PROCESS FOR PREPARING NONCONDUCTIVE SUBSTRATES

[75] Inventor: Salvador Toro, Forest Hills, N.Y.

[73] Assignee: Olin Corporation, Cheshire, Conn.

[21] Appl. No.: 531,602

[22] Filed: Jun. 1, 1990

[51] Int. Cl.⁵ .............................................. C25D 5/34
[52] U.S. Cl. .................................... 205/210; 205/125; 205/131; 205/920; 156/668; 427/306; 427/307
[58] Field of Search .......................... 204/15, 30, 32.1; 427/307, 97; 156/668

[56] References Cited

U.S. PATENT DOCUMENTS

| | | |
|---|---|---|
| 3,962,496 | 6/1976 | Leech . |
| 4,042,729 | 8/1977 | Polichette et al. . |
| 4,054,693 | 10/1977 | Leech et al. . |
| 4,073,740 | 2/1978 | Polichette et al. . |
| 4,233,344 | 11/1980 | Brasch . |
| 4,425,380 | 1/1984 | Nuzzi et al. . |
| 4,430,154 | 2/1984 | Stahl et al. . |
| 4,515,829 | 5/1985 | Deckert et al. . |
| 4,520,046 | 5/1985 | McCaskir et al. .................. 156/668 |
| 4,592,852 | 6/1986 | Courduvelis et al. . |
| 4,592,929 | 6/1986 | Tubergen et al. . |
| 4,601,784 | 7/1986 | Krulik . |
| 4,619,741 | 10/1985 | Minten et al. . |
| 4,629,636 | 12/1985 | Courduvelis et al. . |
| 4,684,560 | 8/1987 | Minten et al. . |
| 4,698,124 | 10/1987 | Krulik . |
| 4,724,005 | 2/1988 | Minten et al. . |
| 4,756,930 | 7/1988 | Kukanskis et al. .................... 427/97 |
| 4,895,739 | 1/1990 | Bladon ................................. 204/15 |
| 4,897,164 | 1/1990 | Piano et al. ........................... 204/15 |
| 4,919,768 | 4/1990 | Bladon ................................. 204/15 |

FOREIGN PATENT DOCUMENTS

| | | |
|---|---|---|
| 79-055933 | of 0000 | Japan . |
| 79-117328 | 9/1979 | Japan . |
| 81-003373 | 1/1981 | Japan . |
| 81-015736 | 4/1981 | Japan . |

OTHER PUBLICATIONS

"Smear Removal Methods" by D. R. Witherell, Multilayer Printed Circuit Board Handbook, Electrochemical Publications Ltd., 1985, Chapter 11.

Primary Examiner—John Niebling
Assistant Examiner—Kishor Mayekar
Attorney, Agent, or Firm—William A. Simons

[57] ABSTRACT

Described herein is a process for desmearing and etching back the surface of a nonconductive substrate which comprises (a) contacting the substrate with a strong acid; (b) then contacting the substrate with an aqueous basic solution; and (c) contacting the substrate with a reducing agent dissolved in a strong acid.

24 Claims, No Drawings

PROCESS FOR PREPARING NONCONDUCTIVE SUBSTRATES

BACKGROUND OF THE INVENTION

1. Field of the Invention

This invention relates to a process for resin desmearing and etchback, especially in the manufacture of printed wiring boards.

2. Brief Description of the Prior Art

Reliability in a multilayer circuit or wiring board is highly dependent on the fabricator's ability to achieve sound mechanical and electrical connections to internal circuits and ground planes. One of the problems that can threaten reliability, known as "drill-smear"—a dielectric material deposited on the hole walls of a printed wiring board during the drilling operation. This material must be removed if reliable interconnections are to be achieved.

C. F. Coombs, Jr. in "Printed Circuits Handbook", third edition, 1988, McGraw-Hill Book Co., section 29.6.13 defines etchback as a process for the controlled removal of nonmetallic materials from sidewalls of holes to a specified depth. It is used to remove resin smear and to expose additional internal conductor surface.

D. R. Witherell in Smear Removal Methods, the Multilayer Printed Circuit Board Handbook, Electrochemical Publications Ltd., 1985, Chapter 11, states that two items are often used when referring to the smear removal processes. The first is known as "chemical cleaning", a process designed for the removal of smear from interconnect surfaces only. No attempt is made to remove dielectric material from the hole walls between individual layers of circuitry although a small amount of removal is a natural consequence of the smear removal process.

A chemical process, designed to remove the smear as well as a layer of nonmetallic materials such as glass-/epoxy between the interconnects, is known as "etchback". The depth of etchback can be varied from something less than 0.0025 mm to a depth as great as 0.075 mm, depending on customer preference. With glass-/epoxy laminates, concentrated sulfuric acid is a selective etchant leaving the glass strands exposed in the hole walls. These strands must be removed in a secondary operation to prevent the growth of plating nodules in subsequent plating steps. This additional operation is not normally required with the chemical cleaning process.

Hydrofluoric acid or ammonium bifluoride are often used to remove the glass fibers in a separate step following etchback. In some applications, the hydrofluoric acid or ammonium bifluoride are mixed with the sulfuric so that the etchback and glass fibre removal can be accomplished in a single step.

U.S. Pat. No. 4,601,784 (Krulik) describes aqueous alkaline liquid $NaMnO_4$ solutions for resin desmearing and etchback in the manufacture of printed circuit boards. The solutions comprise water, alkali metal hydroxide, $NaMnO_4$, and from about 0.1 to about 3.0 moles per mole of $MnO_4^-$ of a co-ion for $MnO_4^-$ selected from $K^+$, $Co^+$, $Rb^+$, and mixtures thereof.

Numerous U.S. and foreign patents and published foreign patent applications have issued which teach different permanganate desmearing and neutralization compositions and/or desmearing or neutralization operations. U.S. Pat. No. 3,962,496 (Leech) teaches of a hydrazine neutralizer solution containing a sequestering agent (e.g. ethylenediamine tetraacetic acid, sodium tartrate, and triethanolamine) and a pH adjustor (e.g. sodium hydroxide, potassium hydroxide, and sodium carbonate).

U.S. Pat. Nos. 4,042,729 (Polichette, et al.) and 4,073,740 (Polichette, et al.) teach a composition for treating a resinous surface to later receive a deposit of electrolessly-formed metal, said composition comprising water, permanganate ion and manganate ion, wherein the molar ratio of manganate ion to permanganate ion is up to 1.2 to 1 and said composition having a pH in the range of 11 to 13.

U.S. Pat. No. 4,054,693 (Leech, et al.) teaches a process of treating a resinous surface by first contacting that surface with the same permanganate ion/manganate ion solution as used in the preceding two patents, then neutralizing the treated resin surface with an aqueous solution comprising hydrazine and then following that neutralization with metallizing that resinous surface with an electroless metal deposition bath.

U.S. Pat. No. 4,233,344 (Braach) teaches treating a composite substrate with a copper-type colloidal system to cause activation of the nonconductive portions thereof for electroless metal deposition, and thereafter treating the activated substrate with an adhesion promoter (i.e., hydrazine hydrate, ammonium persulfate, or alkali hydroxide) prior to electroless metal deposition.

U.S. Pat. No. 4,425,380 (Nuzzi, et al.) teaches a process for preparing a resinous substrate for subsequent metallization, said process comprising first contacting the substrate with an alkaline permanganate treating solution, then contacting said substrate with a water-soluble compound (e.g., tin chloride, sodium bisulfite, hydrochloric acid, or hydroxylamine hydrochloride) to reduce any manganese residues deposited on said substrate to a low oxidation state, and finally contacting said substrate with an alkaline hydroxide solution to remove essentially all of said manganese residues.

U.S. Pat. No. 4,430,154 (Stahl, et al.) teaches a process for making printed circuit boards involving the steps of removing an adhesive coating by treating the board with an aqueous solution containing potassium permanganate and sodium hydroxide, and thereafter treated with an aqueous solution of hydrochloric acid or hydrazine hydrate.

U.S. Pat. No. 4,515,829 (Deckert, et al.) teaches an overall process for manufacturing a printed circuit board having a plurality of metal plated holes interconnecting at least two circuits, including the steps of drilling holes in an epoxy board, forming the circuits, contacting the hole walls with an aqueous alkaline oxygenated epoxy solvent at a pH greater than 10, then contacting the holes with an aqueous alkaline permanganate solution at an elevated temperature and a pH in excess of 13, and also contacting the hole walls with a reducing agent solution.

U.S. Pat. No. 4,592,852 (Courduvelis, et al.) teaches an alkaline composition to improve the adhesion of plastics to electroless metal deposits, said composition containing a source of permanganate ions and a secondary oxidant selected from the group consisting of chlorine, bromine, ozone, hypochlorite salts, metaperiodate salts and trichloro-s-triazinetrione salts.

U.S. Pat. No. 4,592,929 (Tubergen, et al.) teaches a process for the metallization of a plastic which includes the steps of first treating the plastic with a liquid permanganate oxidant solution, then contacting the plastic with a solution containing a reducing agent, a pH adjustor to render the reducing agent active, and a surface active agent in sufficient concentration to reduce the surface tension of the solution to 50 dynes per centimeter or less.

U.S. Pat. No. 4,629,636 (Courduvelis, et al.) teaches a process to improve the adhesion of a plastic to an electroless metal deposit wherein said plastic is contacted with an alkaline permanganate solution which contains permanganate ions, manganate ions, and a secondary oxidant; the secondary oxidant being added at controlled intervals to keep the ratio of permanganate ion concentration to the sum of permanganate and manganate ion concentrations above about 0.5.

U.S. Pat. No. 4,698,124 (Krulik) teaches a method for regenerating spent permanganate ions in a permanganate-containing etchant composition comprising periodically adding an oxidizer selected from the group consisting of an inorganic peroxy disulfate, mixtures of an inorganic peroxy disulfate, and an inorganic hypochlorite, and mixtures of an organic peroxy disulfate, and an inorganic chlorate in an amount to oxidize essentially all of the nonpermanganate manganese species in the composition to Permanganate.

Japanese Pat. No. 81-003373 (which issued on Jan. 24, 1981) and Japanese Pat. No. 81-015736 (which issued on Apr. 11, 1981) teach the use of alkaline solutions of potassium permanganate and sodium or potassium hypochlorite in the treatment of ABS resins prior to electroless metal plating. The alkaline solutions include those having a pH in the range of 11.0 to 12.35 and 12.0 to 13.5, respectively.

Japanese Kokai No. 79-055933 and Japanese Kokai 79-117,328, the latter published on Sept. 12, 1979, teach an electroless plating on plastics process involving etching the plastics with aqueous solution containing potassium permanganate and persulfate prior to electroless metal plating.

U.S. Pat. Nos. 4,619,741; 4,684,560 and 4,724,005, which issued to Karl L. Minten and Galina Pismennaya, on Oct. 28, 1986; Aug. 4, 1987; and Feb. 9, 1988, respectively, teach a process of electroplating the through holes of a PWB which is a significant improvement over the known electroless techniques. By this process, a liquid dispersion of carbon black particles is first applied to the nonconductive portions of the through holes; then the liquid dispersion medium is separated (i.e., evaporated) from the carbon black particles, thereby depositing a substantially continuous layer of carbon black particles on the nonconductive surfaces of the through holes; and next a substantially continuous metal layer is electroplated over the deposited carbon black layer. This process of Minten and Pismennaya has several advantages over the known electroless techniques including the elimination of the preactivator, the Pd/Sn activator and the accelerator; less possibility of pollution problems; better bath stability; and fewer possible side reactions. This disclosure of the above-mentioned U.S. Patents of Minten and Pismennaya is incorporated herein by reference in their entirety.

Improvements and modifications of this Minten and Pismennaya process are shown in U.S. Pat. Nos. 4,622,107 (Piano); 4,622,108 (Polakovic and Piano); 4,631,117 (Minten, Battisti, and Pismennaya); and 4,718,993 (Cupta and Piano); 4,874,477 (Pendleton) and U.S. Pat. No. 4,897,164 (Piano and Galvez). The first of these patents teaches the use of a gas-forming compound (e.g. sodium carbonate) to remove loose or easily removable carbon black particles in the through holes. The second of these patents teaches the contacting of a alkaline hydroxide preconditioning solution to the through hole walls before application of the carbon black dispersion so that the carbon black dispersion will have better adhesion to the walls. The third listed patent teaches the use of this carbon black dispersion as a preactivator for electroless plating of the through holes. The fourth teaches the use of an alkaline silicate solution before the carbon black dispersion. The fifth patent teaches the use of an aqueous polyelectrolyte homopolymer conditioner solution before the carbon black dispersion bath. The sixth patent teaches the use of an alkaline borate solution to remove excess carbon black material on the rims and inner metal walls of the PWB through hole walls which might cause an undesirable, uneven plated surface to result. All of the above U.S. and foreign patents and publications are incorporated herein by reference in their entireties.

BRIEF SUMMARY OF THE INVENTION

The present invention provides a process for desmearing and etching back the surface of a nonconductive surface.

The present invention additionally provides an improved electroplating process for applying a conductive metal layer to a nonconducting material such as the through hole walls of printed wiring boards over the process disclosed in the above-noted Minten and Pismennaya patents.

The present invention comprises treating a nonconductive substrate comprising the following steps:

(a) contacting said substrate with a strong acid, such as concentrated sulfuric acid or methane sulfonic acid;

(b) then contacting the substrate with an aqueous basic solution; and (c) contacting the substrate with a reducing agent dissolved in a strong acid.

The process of this invention is particularly useful for desmearing and etching back the surface of hole walls of PWB's and then applying a conductive metal surface such as copper to the nonconducting portions of through hole walls of printed wiring boards. These printed wiring boards are usually composed of a nonconductive layer (e.g., epoxy resin/glass fiber mixture) positioned between two conductive metal layers (e.g., copper or nickel plates or foils) or a multiplicity of said alternating layers. Applying a conducting metal layer over said nonconducting portions of said through hole walls electrically connects the conductive metal layers. However, the process of this invention is effective for electroplating a conductive metal onto the surface of a nonconducting material (e.g., nonconductive plastics or resins or ceramics) of virtually any shape or surface area.

DESCRIPTION OF THE PREFERRED EMBODIMENTS

As stated above, one preferred embodiment of the present invention is preparing the through hole walls of a printed wiring board for the application of an electroplated plated layer of metal. Printed wiring boards (also known as printed circuit boards) are generally laminated materials comprised of two or more plates or foils of copper, which are separated from each other by a layer of nonconducting material. Although copper is generally used as the electroplating metal in printed wiring boards, those skilled in the art will recognize that other metals such as nickel, gold, palladium, silver and the like can also be electroplated by the process of this invention. The nonconducting layer or layers are preferably an organic material such as an epoxy resin impregnated with glass fiber particles. However, the nonconducting layer may also be comprised of thermosetting resins, thermoplastic resins, and mixtures thereof, with or without reinforcing materials such as fiberglass and fillers.

Suitable thermoplastic resins include the acetal resins; acrylics, such as methyl acrylate; cellulosic resins, such as ethyl cellulose, cellulose acetate, cellulose propionate, cellulose acetate butyrate, cellulose nitrate, and the like; chlorinated polyethers; nylon; polyethylene; polypropylene; polystyrene; styrene blends, such as acrylonitrile styrene copolymers and acrylo-nitrile-butadiene-styrene (ABS) copolymers; polycarbonates; polychlorotrifluoroethylene; and vinyl polymers and copolymers, such as vinyl acetate, vinyl alcohol, vinyl butyral, vinyl chloride, vinyl chlorideacetate copolymer, vinylidene chloride and vinyl formal; and the like.

Suitable thermosetting resins include alkyl phthalate; furane; melamine-formaldehyde; phenol formaldehyde and phenol-furfural copolymers; alone or compounded with butadiene acrylonitrile copolymer or acrylonitrile-butadiene-styrene (ABS) copolymers; polyacrylic esters; silicones; urea formaldehydes; epoxy resins; polyimides; alkyl resins; glyceryl phthalates; polyesters; and the like.

In many printed wiring board designs, the electrical pathway or pattern requires a connection between the separated copper plates at certain points in the pattern. This is usually accomplished by drilling holes at the desired locations through the laminate of copper plates and the nonconducting layer and then connecting the separate metal plates. The hole diameters of printed wiring boards generally range from between about 0.5 and about 10 millimeters in diameter, and preferably from about 1 to about 5 millimeters.

After drilling these through holes, it may be desirable to deburr the holes to make the hole walls relatively smooth. In the case of multilayer printed wiring boards, it may also be desirable to subject the boards to desmearing operations to clean the inner copper interfacing surfaces of the through holes and to etchback non-metallic materials from sidewalls of through holes to a specified depth.

According to the present invention, printed wiring boards having through holes are treated by a process which comprise the following steps:

(a) contacting the PWB with a strong acid, such as concentrated sulfuric acid or methane sulfonic acid;

(b) then contacting the PWB with an aqueous basic solution; and (c) contacting the PWB with a reducing agent dissolved in a strong acid, such as hydrochloric, sulfuric or methanesulfonic acids.

The strong acids which can be used in step (a) are preferably concentrated sulfuric acid or methane sulfonic acid. The acid is used at a concentration of from about 94 to about 98%; preferably from about 96 to about 98%. The substrate is treated with the acid at a temperature of from about 60° to about 120° F., preferably from about 70° to about 100° F. The substrate is treated for a period of from about 15 seconds to about 600 seconds, preferably from about 30 seconds to about 180 seconds.

The aqueous basic solution of step (b) contains an alkali or alkaline earth metal hydroxide, such as sodium hydroxide dissolved in water. The solution is used in concentrations of from about 50 to about 70 g/l, preferably in a concentration of about 55 to about 65 g/l. The substrate is heated at a temperature of from about 120° to about 180° F., preferably from about 140° to about 160° F. The substrate is treated for a period of from about 60 to about 600 seconds, preferable from about 180 to about 300 seconds.

In step (c), the substrate is contacted with a reducing agent dissolved in a strong acid. The strong acids which may be used in this step include hydrochloric, concentrated sulfuric, methane sulfonic and fluoroboric acids. The reducing agents include dihydrazine sulfate, hydroxylamines, ethanolamine dissolved in carbinol, glycol ethers, and the like. The concentration to the acid in the solution with reducing agent is from about 0.05 to about 10, preferably from about 1 to about 5% by volume. The substrate is treated at a temperature of from about 120° to about 150°, preferably from about 130° to about 145° F. The substrate is treated for a period of from about 60 to about 600 seconds, preferably from about 180 seconds to about 400 seconds.

Generally, the substrate is rinsed with water after each of the steps.

Once the surfaces of through holes have been made relatively smooth for plating, it is preferred to subject the PWB to a precleaning process in order to place the printed writing board in condition for receiving the liquid carbon black dispersion. In one preferred precleaning operation, the printed wiring board is first placed in a cleaner/conditioner bath for about 1 to 10 minutes at a temperature of bout 45° C. to about 70° C. to remove grease and other impurities from the hole wall surfaces. In this embodiment, one preferred cleaner is comprised of monoethanolamine, a nonionic surfactant and ethylene glycol in water; which is available as "BLACKHOLE Cleaner 2" from the Olin Hunt Specialty. Products Inc. of West Paterson, N.J.

After the application of the cleaner, the PWB is subsequently rinsed in water to remove excess cleaner from the board and then contacted with a conditioner solution. The preferred method of contacting with a conditioner is dipping the cleaned PWB into a room temperature aqueous conditioner bath for about 1–10 minutes. This conditioner solution is used to ensure that substantially all of the hole wall glass/epoxy surfaces are properly prepared to accept a continuous layer of the subsequent carbon black particles. Such conditioner solutions have been customarily used in electroless processing to precondition the boards for the electroless chemistry. See U.S. Pat. No. 4,634,691, which issued to Lindsey on Jan. 6, 1987, for a discussion of conditioner solution. The Lindsey patent is incorporated herein by reference in its entirety. One preferred conditioner is "BLACKHOLE Conditioner" available from Olin Hunt Specialty Products Inc. of West Paterson, N.J. This conditioner formulation comprises the mixture of monoethanolamine and a polyamine resin in water and has a pH of about 10. The preferred concentration of total conditioner ingredients in water is from about 1% to about 10% by weight.

If the cleaner solution precedes the aqueous cleaner solution, it is preferred to rinse the treated board in a water rinse between the cleaner solution and the conditioner solution. It is also preferred to use a water rinse bath after the conditioner treatment.

The liquid carbon black dispersion is next o applied to or contacted with the conditioned PWB. This dispersion contains three critical ingredients, namely, carbon black, one or more surfactants capable of dispersing the carbon black and a liquid dispersing medium such as water. The preferred method of applying the dispersion to the PWB include immersion, spraying or other methods of applying chemicals used in the PWB industry. A single working bath is sufficient for applying this carbon black dispersion; however, more than one bath may be used for rework or other purposes.

In preparing this liquid dispersion, the three critical ingredients and any other preferred ingredients are thoroughly mixed together to form a stable dispersion. This may be accomplished by subjecting a concentrated form of the dispersion to ball milling, colloidal milling, high-shear milling, ultrasonic techniques or other standard blending techniques. The thoroughly mixed dispersion is later diluted with more water while agitating to the desired concentration for the working bath. The preferred method of mixing is ball milling a concentrated form of the dispersion in a container having glass, mineral, or plastic beads therein for a period of about 1 to about 24 hours. This thorough mixing allows for the carbon black particles to be intimately coated or wetted with the surfactant. This mixed concentrate is then mixed with water or some other liquid dispersing medium to the desired concentration. The working bath is preferably kept agitated during both the diluting and applying steps to aid in keeping the dispersion stable.

As stated above, the carbon black particles should have an average particle diameter below about 3 microns while in the dispersion. It is desirable to have this average particle diameter of carbon black as small as possible to obtain the desired plating characteristics of substantially even plating and no plating pullaways. It is preferred that the carbon black particles have an average particle diameter from about 0.1 to about 3.0 microns, more preferably from 0.2 to about 2.0 microns, when in said dispersion. The term "average particle diameter" as employed herein in both the specification and claims refers to average mean diameter of the particles (the average by number). The average mean diameter in the dispersion may be determined through the use of either a NiComp Model 270 submicron particle size analyzer (Version 3.0) or a HIAC PA-720 automatic particle size analyzer (both available from the HIAC/ROYCO Instrument Division of Pacific Scientific of Menlo Park, Calif.).

All types of carbon blacks may be used for this invention including the commonly available furnace blacks. However, it is preferred to utilize carbon blacks which are initially acidic or neutral, i.e., those which have a pH of between about 1 and about 7.5 and more preferably between about 2 and about 4 when slurried with water. Carbon black particles of the preferred type contain between about 1% and about 10% by weight of volatiles and have an amorphous structure.

These preferred carbon black particles are also very porous and generally their surface areas are from between about 45 to about 1,100, and preferably between about 300 to about 600, square meters per gram as measured by the BET method (method of Brunauer-Emmett-Teller).

Illustrative carbon blacks suitable for use of this invention include Cabot XC-72R Conductive, Cabot Monarch 800, Cabot Monarch 1300, all manufactured by Cabot Corporation of Boston, Mass. Other suitable carbon blacks include Columbian T-10189, Columbian Conductex 975 Conductive, Columbian CC-40-220, and Columbian Raven 3500, all available from Columbian Carbon Company of New York, N.Y. Monarch 800 and Raven 3500 are the two most preferred carbon blacks because of their ease of dispersion and low pH.

The term "liquid dispersing medium" as used herein in the present specification and claims includes water and polar organic solvents (both protic and aprotic). Suitable protic polar organic solvents may include lower alcohols ($C_1-C_4$) such as methanol, ethanol, isopropanol and isobutanol; polyhydric alcohols such as glycols (i.e. triethylene glycols); ether-alcohols such as cellosolve; organic acids, such as formic acid and acetic acid; acid derivatives such as trichloroacetic acid; and sulfonic acids such as methane sulfonic acid. Suitable aprotic polar organic solvents include aldehydes such as acetaldehyde; ketones such as acetone; aprotic aromatic solvents such as toluene and mineral spirits; aprotic halogenated hydrocarbons such as dichlorofluoromethane and dichlorodifluoromethane (FREON); dimethylformamide (DMF); N-methyl-pyrolidone; dimethylsulfoxide (DMSO); and esters of carboxylic acids such as methylformate, ethylacetate and cellosolve acetate. The preferred liquid dispersing medium is water because of cost and ease of use considerations. It is preferred to utilize deionized water which is free of lime, fluorine, iodine and other impurities normally found in tap water, in order to minimize interference of foreign ions during the subsequent electroplating step.

In addition to the water and carbon black, a third critical ingredient is needed in the dispersion, namely, a surfactant capable of dispersing said carbon black in said liquid dispersing medium (i.e., compatible with said carbon black and liquid dispersing medium). One or more of these is added to the dispersion in order to enhance the wetting ability and stability of the carbon black and permit maximum penetration by the carbon black within the pores and fibers of the nonconducting layer. Suitable wetting agents include anionic, nonionic and cationic surfactants (or combinations thereof such as amphoteric surfactants). The surfactants should be soluble, stable and preferably nonfoaming in the liquid carbon black dispersion. In general, for a polar continuous phase as in water, the surfactants should preferably have a high HLB number (8–18). The preferred type of surfactant will depend mainly on the pH of the dispersion. If the total dispersion is alkaline (i.e., has an overall pH in the basic range), it is preferred to employ an anionic or nonionic surfactant. Acceptable anionic surfactants include sodium or potassium salts of naphthalene sulfonic acid such as DARVAN No. 1 (R. T. Vanderbilt Co.), ECCOWET LF (Eastern Color and Chemical), PETRO AA, PETRO ULF (Petro Chemical Co., Inc.), and AEROSOL OT (American Cyanamid). Preferred anionic surfactants include neutralized phosphate ester-type surfactants such as MAPHOS 55, 56, 8135, 60A, L6 (Mazer Chemicals Inc.). The most preferable anionic surfactant for a liquid carbon black dispersion is MAPHOS 56. Suitable nonionic surfactants include ethoxylated nonyl phenols such as POLY-TERGENT ® B-Series (Olin Corporation) or alkoxylated linear alcohols such as POLY-TERGENT SL-Series (Olin Corporation).

If the total dispersion is acidic, it is preferred to employ selected anionic surfactants or cationic surfactants. An acceptable group of anionic surfactants would be the sodium or potassium salts of naphthalene sulfonic acid described above. Acceptable cationic surfactants include cetyl dimethyl benzyl ammonium chloride such as AMMONYX T (Onyx Chemical Corporation); an ethanolated alkylguanidine amine complex such as AEROSOL C-61 (American Cyanamid); lipocals; dodecyldiphenyl oxide disulfonic acid (DDODA) such as DOWFAX 2A1 (Dow Chemical); a sodium salt of DDODA such as STRODEX (Dexter Chemical Corporation); and salts of complex organic phosphate esters. Preferred surfactants include amphoteric potassium salts of a complex amino acid based on fatty amines such as MAFO 13 and cationic ethoxylated soya amines such as MAZEEN S-5 or MAZTREAT (Mazer Chemicals Inc.). Combinations of surfactants may be employed. The term "surfactant", as used herein for making the carbon black dispersion, may include other forms of dispersing agents or aids such as low molecular weight polyelectrolytes and polymers.

The amount of carbon black in the dispersion should be less than about 4% by weight of the dispersion, preferably, less than about 2% by weight. It has been found that the use of higher concentrations of carbon blacks provide undesirable plating characteristics. In the same regard, the solids content (i.e. all of the ingredients other than the liquid dispersing medium) is preferably less than 10% by weight of the dispersion, more preferably, less than about 5.6% by weight.

The three above-noted critical components of the present invention, namely, the carbon black, liquid dispersing medium and surfactant, may be employed alone to form a liquid dispersion. In some situations, it may be desirable to add other preferred ingredients to this dispersion.

One additional preferred component of the liquid carbon black-containing dispersion is a strong basic material such as an alkaline hydroxide. Suitable strong basic materials include alkali metal hydroxides such as potassium hydroxide, sodium hydroxide, and lithium hydroxide. Ammonium hydroxide or alkaline earth metal hydroxides such as calcium hydroxide may also be employed, if desired. Potassium hydroxide is the most preferred strong basic material. The term "alkaline hydroxide" is used throughout the description and claims to identify these strong basic materials. Sufficient alkaline hydroxide may be added to the liquid carbon black dispersion in a proportion sufficient to increase the pH of the resulting carbon black-containing dispersion to between about 10 and about 14, and preferably between about 10 and about 12.

Following is a typical formulation of a suitable aqueous alkaline dispersion of carbon black showing the general range of proportions as well as the preferred range of proportions for the various components:

| Component | General Range | Preferred Range |
|---|---|---|
| Carbon Black | 0.1–4% by wt. | 0.15–2% by wt. |
| Surfactant | 0.01–4% | 0.05–2% |
| Alkaline Hydroxide | 0–1% | 0.4–0.8% |
| Water | Balance | Balance |

The liquid dispersion of carbon black is typically placed in a suitably agitated vessel and the printed wiring board to be treated is immersed in, sprayed with or otherwise contacted with the liquid dispersion. The temperature of the liquid dispersion in an immersion bath is maintained in the range of between about 15° C. and about 35° C. and preferably between about 20° C. and about 30° C., while the conditioned printed wiring board is immersed therein. The period of immersion generally ranges from about 1 to 10, and preferably from about 3 to 5 minutes. During immersion, the liquid carbon black-containing dispersion penetrates the holes of the printed wiring board and wets and contacts the glass fiber as well as the epoxy resin which forms the components of the insulating layer. The immersed board is then removed from the liquid carbon black-containing dispersion bath.

The carbon black-covered board is then subjected to a step where substantially all (i.e., more than about 95% by weight) of the water in the applied dispersion is removed and a dried deposit containing carbon black is left in the holes and on other exposed surfaces of the nonconducting layer. This may be accomplished by several methods such as by evaporation at room temperature, by a vacuum, or by heating the board for a short time at an elevated temperature, or by other equivalent means. Heating at an elevated temperature is the preferred method. Heating is generally carried out for between about 30 seconds and 45 minutes at a temperature of from about 75° C. to 120° C., more preferably from about 80° C. to 98° C. To insure complete coverage of the hole walls, the procedure of immersing the board in the liquid carbon black dispersion and then drying may be repeated one or more times.

This drying step yields a board which may be completely coated with the carbon black dispersion. This dispersion is not only coated on the drilled hole surfaces, which is desirable, but also entirely coats the copper plate or foil surfaces which is undesirable. Thus prior to many subsequent operations all carbon black must be removed from the copper plate or foil surfaces.

As an optional feature of the present invention, the dried deposit of carbon black in the through holes is then contacted with an aqueous alkaline solution containing an alkali metal borate. The preferred alkali metal borate is sodium borate. The preferred pH range of this alkaline solution is from about 9.5 to 11.0. The Preferred bath temperature is from about 20° C. to 50° C. The functions of this step include removing excess carbon black material on the rims and inner metal walls of the PWB through holes and remove any loose carbon black particles from the through hole walls which might cause an undesirable uneven plated surface to result. The alkali metal borate also increases the surface porosity of the carbon black.

If used, the amount of alkali borate should be sufficient to remove substantially all of the loose or easily removable carbon black particles from the areas of the through holes. The preferred concentration may vary from about 2 to 50 grams per liter of water employed. This contacting step may be carried out by placing the PWB in an aqueous bath containing the alkali metal borate at a temperature from about 20° C. to 50° C. for about 20 seconds to 5 minutes.

The further removal of the carbon black, specifically from the outer copper surfaces including, especially, the rims of the drilled holes while leaving the coating intact on the glass fibers and epoxy surface of the hole walls, may be achieved by the employment of a microetch bath. Generally, this treatment is carried out at a temperature of about 20° C. to 30° C. for 35 seconds to about 3 minutes. One suitable sodium persulfate-based microetch is "BLACKHOLE MICROCLEAN I" available from Olin Hunt Specialty Products Inc. This product is preferably combined with sufficient sulfuric acid to make a microetch bath containing 100-300 grams of sodium persulfate per liter of deionized water and about 1 to 10% by weight sulfuric acid. The mechanism by which this microetch works is by not attacking the carbon black material deposited on the copper foil directly, but rather to attack exclusively the first few atomic layers of copper directly below which provides the adhesion for the coating. Hence, the fully coated board is immersed in the microetch solution to "flake" off the carbon black from the copper surfaces in the form of micro-flakelets. These micro-flakelets are removed from the microetch bath either by filtration through a pump or via a weir type filter arrangement commonly used in the PWB industry. The liquid carbon black dispersion, the alkali metal borate treatment, the microetch treatment, and the intermittent water rinses are preferably carried out by immersing the PWB in baths constructed of polypropylene or polyvinyl chloride (PVC) and kept agitated by a recirculation pump or pumped in air.

After the microetch step and a subsequent water rinse, the PWB may now either proceed to the photoimaging process and later be electroplated or be directly panel electroplated. It may be preferred to further clean the PWB with a citric acid anti-tarnish solution or any other acid cleaner solution or both after the above microetch step.

The thus treated printed wiring board is then ready for electroplating operation which includes immersing the PWB in a suitable electroplating bath for applying a copper coating on the hole walls of the nonconducting layer.

The present invention contemplates the use of any and all electroplating operations conventionally employed in applying a metal layer to the through hole walls of a PWB. Therefore, this claimed invention should not be limited to any particular electroplating bath parameters.

A typical copper electroplating bath is comprised of the following components in the following proportions:

| Component | General Proportions | Preferred Proportions |
|---|---|---|
| Copper (as metal) | 2-3 oz/gal | 2.25-2.75 oz/gal |
| Copper Sulfate | 5-10 oz/gal | 6-9 oz/gal |
| 98% Concentrated $H_2SO_4$ (by weight) | 23-32 oz/gal | 27-30 oz/gal |
| Chloride Ion | 20-100 mg/l | 40-60 mg/l |

The electroplating bath is normally agitated preferably maintained at a temperature of between about 20° C. and 25° C. The electroplating bath is provided with anodes, generally constructed of copper, and the printed wiring board to be plated is connected as a cathode to the electroplating circuit. For example, a current of about 30 amps per square foot is impressed across the electroplating circuit for a period of between about 40 and 60 minutes in order to effect copper plating on the hole walls of the nonconducting layer positioned between the two plates of copper up to a thickness of about 1 mil±0.2 mil. This copper plating of the hole wall provides a current path between the copper layers of the printed wiring board. Other suitable electroplating conditions may be employed, if desired. Other electroplating bath compositions containing other copper salts or other metal salts such as salts of nickel, gold, palladium, silver and the like may be employed, if desired.

The printed wiring board is removed from the copper electroplating bath and then washed and dried to provide a board which is further processed. For example, the PWB may be subjected to a tin-lead electroplating operation.

The following examples are presented to define the invention more fully without any intention of being limited thereby. All parts and percentages are by weight unless otherwise explicitly specified.

PRINTED WIRING BOARD SPECIFICATIONS

Six multilayer laminated printed wiring boards were treated by the process of this invention. These multilayer printed wiring boards were comprised of four 35 micron thick copper plates secured by pressure fusing them with epoxy resin/glass fiber layers in an alternating fashion. These printed wiring boards were about 15.24 centimeters wide and about 22.86 centimeters in length. There were about 500 to about 1,000 holes, each about 1.0 millimeter in diameter drilled through the copper plates and epoxy resin/glass fiber layer.

EXAMPLE 1

These multilayer printed wiring boards described above were prepared for copper electroplating their through holes by first mechanically scrubbing the surfaces of the board. They were then prepared for copper electroplating by first contacting them with the following sequence of desmear steps with the solutions and indicated times:
1. Concentrated sulfuric acid (45 seconds)
2. Rinse with tap water (2 minutes)
3. Cleaner 101 (5 minutes)
4. Rinse with tap water (2 minutes)
5. Neutralizer/Glass etch
6. Rinse with tap water (2 minutes)

Bath 1 was 98% by weight concentrated sulfuric acid. The bath was operated at room temperature (about 75° F.). The purpose of this bath was to remove smeared epoxy resin from the interconnects of the drilled through-hole.

Bath 3 was an aqueous solution containing a cleaner formulation comprised of sodium hydroxide, a nonionic surfactant and inorganic builders to neutralize the acidity from the previous step and to micro-roughen the epoxy surface for better adhesion of the subsequent copper deposit. The bath was heated to 155° F. to improve its efficacy. The cleaner formulation is available as "Endura-Plate Cleaner 101" from Olin Hunt Specialty Products Inc. of West Paterson, N.J.

Bath 5 was an aqueous acidic bath which contains 15% by weight dihydrazine sulfate and 1% fluoroboric acid to remove protruding glass fibers resulting from Bath 1. The bath was operated at 150° F. to improve its efficacy. The neutralizer formulation is available as "Permolin 703" from Olin Hunt Specialty Products Inc. of West Paterson, N.J.

Rinse Baths 2, 4, and 6 were employed to prevent the carryover of chemicals from one treatment bath into the next.

After treatment with this sequence of baths, the printed wiring boards were then immersed in the following sequence of aqueous baths (each about 132 liters volume) for the indicated times:
1. Cleaner (5 minutes)
2. Rinse with tap water (2 minutes)

3. Conditioner (4 minutes)
4. Rinse with tap water (2 minutes)
5. Carbon black preplating dispersion (4 minutes); then dry at 93° C. for 20 minutes
6. Sodium borate premicroetch conditioner (30 seconds)
7. Rinse with tap water (20 seconds)
8. Sodium persulfate microetch (30 seconds)
9. Rinse with tap water (20 seconds)
10. Anti-tarnish solution (20 seconds)
11. Rinse with tap water (20 seconds)

Bath 1 was an aqueous solution containing a cleaner formulation comprised of monoethanolamine, a nonionic surfactant and ethylene glycol in water to remove grease and other impurities from the surfaces of the boards. The bath was heated to about 60° C. to facilitate this cleaning. The cleaner formulation is available as "BLACKHOLE Cleaner 2" from Olin Hunt Specialty Products Inc. of West Paterson, N.J.

Bath 3 was a room temperature aqueous alkaline bath which contains monoethanolamine and a polyelectrolyte copolymer and has a pH of about 10 to condition the hole wall surfaces of the board. The conditioner formulation is available as "BLACKHOLE Conditioner" from Olin Hunt Specialty Products Inc. of West Paterson, N.J.

Bath 5 was a room temperature deionized water bath containing the carbon black preplating formulation. In this bath, the proportions of each ingredient were as follows:
  0.094 by weight anionic surfactant
  0.600 by weight KOH
  0.310 by weight carbon black
  1.004 by weight solids This carbon black dispersion of Bath 5 was prepared by milling a concentrated form of this dispersion in a pebble mill containing stone pebbles so that the concentration of pebbles occupied about one-third of the mill volume. The surfactant was dissolved in deionized water/KOH to give a continuous phase. Then, the carbon black was added. Milling time was six hours. After milling, the concentrate was diluted with sufficient deionized water to make the dispersion in the above-indicated proportions.

After Bath 5, the boards were placed in a hot air recirculating oven and heated to 93° C. for 20 minutes. This drying step removed the water from the carbon black-coating on the board, thereby leaving a dried deposit of carbon black all over the board and in the through holes of the boards. The drying promotes adhesion between the carbon black and the nonconductive surfaces of the board.

Bath 6 was an aqueous bath heated to 43° C. and contained 10 grams of sodium tetraborate decahydrate and about 5.2 grams of liquid caustic soda per liter of deionized water to adjust the pH to 10.5. Its function was to facilitate the removal of dried carbon black material from the rim of the through holes as well as other copper surfaces of the boards in the following sodium persulfate/$H_2SO_4$ microetch step. This sodium borate premicroetch conditioner is available as "BLACKHOLE MICRO-PREP SR" from Olin Hunt Specialty Products Inc. of West Paterson, N.J.

Bath 8 was a room temperature aqueous bath and contained 200 grams of sodium persulfate per liter of deionized water and 0.5% by volume of the copper surfaces. It does not act on the resin/glass surfaces. This sodium persulfate microetch was made from "BLACKHOLE MICROCLEAN I" and is available from Olin Hunt Specialty Products Inc. of West Paterson, N.J.

Bath 10 was a room temperature aqueous bath and contained 50 grams of citric acid per liter of deionized water and 0.5% by volume of concentrated $H_2SO_4$. Its function was to prevent the copper surfaces of the printed wiring boards from tarnishing.

Rinse Baths 2, 4, 7, and 11 were employed to prevent the carryover of chemicals from one treatment bath into the next.

After treatment with this sequence of baths, the printed wiring boards were placed in an electroplating bath provided with an agitation means and heating means and which contained an electrolyte bath comprised of the following:

| PLATING BATH COMPOSITION | |
|---|---|
| COMPONENT | PROPORTIONS |
| Copper (as metal) | 2.5 oz./gal. |
| Copper sulfate | 6.2 oz./gal. |
| 98% Concentrated $H_2SO_4$ | 30 oz./gal. (by wt.) |
| Chloride ion | 40 mg/l |

The printed wiring boards were connected as cathodes in the electroplating vessel having a volume of about 720 liters. Twelve copper bars were immersed in the electrolyte and connected to the cell circuits as anodes. The copper boards had a length of about 91 cm; a width of about 9 cm, and a thickness of about 4 cm. Each face was about 819 square cm. A direct current of 30 amps per square foot was impressed across the electrodes in the electroplating bath for approximately 55 minutes. The bath was maintained at a temperature of about 25° C. during this period and agitation was effected by air sparging. At the end of this period, the printed wire board was disconnected from the electrolyte, washed with tap water, and dried.

After this electroplating step, an examination of the printed wiring boards showed that the holes were coated with a relatively uniform layer of copper (1 to 1.2 mils) and no "dog boning" was observed (i.e., this latter effect is an undesirable condition where the plated layer is thicker near the copper laminate areas of the PWB). In a standard adhesion test, there was no removal of the electroplated copper from the hole walls of the epoxy/glass fiber layer component.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A process for treating a nonconductive substrate consisting essentially of the following steps:
    (a) contacting said substrate with a strong acid solution selected from the group consisting of concentrated sulfuric acid and methane sulfonic acid;
    (b) then contacting the substrate with an aqueous basic solution consisting essentially of an alkali metal hydroxide or an alkaline earth metal hydroxide as the base; and (c) contacting the substrate with a reducing agent dissolved in a strong acid wherein said reducing agent is selected from the group consisting of an hydroxyl amine, dihyrazine sulfate, ethanolamine, and a glycol ether, and wherein said strong acid is selected from the group consisting of fluoroboric acid, hydrochloric acid, concentrated sulfuric acid, and methane sulfonic acid.

2. The process of claim 1 wherein the concentration of said acid in said acid solution of step (a) is from about 94% to about 98%.

3. The process of claim 1 wherein step (a) is conducted at a temperature from about 60° F. to about 120° F.

4. The process of claim 1 wherein said base is sodium hydroxide.

5. The process of claim 1 wherein the concentration of base is from about 50 g/l to about 70 g/l.

6. The process of claim 1 wherein said step (b) is conducted at a temperature from about 120° F. to about 180° F.

7. The process of claim 1 wherein concentration of acid in said aqueous acid solution of step (c) is from about 0.5 to about 10% by volume.

8. The process of claim 1 wherein said step (c) is conducted at a temperature from about 120° F. to about 150° F.

9. A process for desmearing resin from the inside walls of holes formed in resinous substrates consisting essentially of the following steps:
   (a) contacting the substrate with a strong acid solution selected from the group consisting of concentrated sulfuric acid and methane sulfonic acid;
   (b) then contacting the substrate with an aqueous basic solution consisting essentially of an alkali metal hydroxide or an alkaline earth metal hydroxide as the base; and
   (c) contacting the substrate with a reducing agent dissolved in a strong acid wherein said reducing agent is selected from the group consisting of an hydroxyl amine, dihyrazine sulfate, ethanolamine, and a glycol ether, and wherein said strong acid is selected from the group consisting of fluoroboric acid, hydrochloric acid, concentrated sulfuric acid, and methane sulfonic acid.

10. A process for etching back the surface of a circuit board consisting essentially of the following steps:
    (a) contacting the circuit board with a strong acid solution selected from the group consisting of concentrated sulfuric acid and methane sulfonic acid;
    (b) then contacting the circuit board with an aqueous base solution consisting essentially of an alkali metal hydroxide or an alkaline earth metal hydroxide as the base; and
    (c) contacting the circuit board with a reducing agent dissolved in a strong acid wherein said reducing agent is selected from the group consisting of an hydroxyl amine, dihydrazine sulfate, ethanolamine, and a glycol ether, and wherein said strong acid is selected from the group consisting of fluoroboric acid, hydrochloric acid, concentrated sulfuric acid, and methane sulfonic acid.

11. A process for electroplating a metal layer to the surface of a nonconductive substrate which consisting comprises essentially of the following steps:
    (a) contacting said substrate with a strong acid solution selected from the group consisting of concentrated sulfuric acid and methane sulfonic acid;
    (b) then contacting the substrate with an aqueous basic solution consisting essentially of an alkali metal hydroxide or an alkaline earth metal hydroxide as the base; and
    (c) then contacting the substrate with a reducing agent dissolved in a strong acid wherein said reducing agent is selected from the group consisting of an hydroxyl amine, dihydrazine sulfate, ethanolamine, and a glycol ether, and wherein said strong acid is selected from the group consisting of fluoroboric acid, hydrochloric acid, concentrated sulfuric acid, and methane sulfonic acid;
    (d) then contacting the substrate with a liquid dispersion of carbon black comprised of:
        (1) carbon black particles having an average particle size of less than about 3 microns in said dispersion;
        (2) an effective dispersing amount of a surfactant which is compatible with said carbon black; and
        (3) a liquid dispersing medium, wherein the amount of carbon black is sufficient to coat substantially all of the nonconducting substrate and is less than about 4% by weight of said liquid dispersion;
    (e) separating substantially all of the liquid dispersing medium from said applied dispersion, thereby depositing said carbon black particles in a substantially continuous layer on said nonconductive substrate surface; and
    (f) electroplating a substantially continuous layer over the deposited carbon black layer on said nonconducting substrate.

12. The process of claim 11 wherein the concentration of said acid in said acid solution of step (a) is from about 94% to about 98%.

13. The process of claim 11 wherein step (a) is conducted at a temperature from about 60° F. to about 120° F.

14. The process of claim 1 wherein said base is sodium hydroxide.

15. The process of claim 11 wherein the concentration of base is from about 50 g/l to about 70 g/l.

16. The process of claim 11 wherein said step (b) is conducted at a temperature from about 120° F. to about 180° F.

17. The process of claim 11 wherein concentration of acid in said aqueous acid solution of step (c) is from about 0.5 to about 10% by volume.

18. The process of claim 11 wherein said step (c) is conducted at a temperature from about 120° F. to about 150° F.

19. A process for electroplating the walls of through holes in a laminated printed wiring board comprised of at least one nonconducting layer laminated to and alternating with at least two separate conductive metal layers, which consists essentially of the following steps:
    (a) desmearing the walls of said through holes by:
        (1) contacting said substrate having said through holes with a strong acid solution selected from the group consisting of concentrated sulfuric acid and methane sulfonic acid;
        (2) then contacting said substrate having said through holes with an aqueous basic solution consisting essentially of an alkali metal hydroxide or an alkaline earth metal hydroxide as the base; and
        (3) then contacting said substrate having said through holes with a reducing agent dissolved in a strong acid wherein said reducing agent is selected from the group consisting of an hydroxyl amine, dihydrazine sulfate, ethanolamine, and a glycol ether, and wherein said strong acid is selected from the group consisting of fluoroboric acid, hydrochloric acid, concentrated sulfuric acid, and methane sulfonic acid;

(b) then contacting said substrate having said through holes with a liquid dispersion of carbon black comprised of:

(1) carbon black particles having an average particle size of less than about 3.0 microns in said dispersion;

(2) an effective dispersing amount of a surfactant which is compatible with said carbon black; and (3) a liquid dispersing medium, wherein the amount of carbon black is sufficient to coat substantially all of said nonconducting surfaces of the hole walls and is less than about 4% by weight of said liquid dispersion;

(c) separating substantially all of the liquid dispersing medium from said applied dispersion, thereby depositing said carbon black particles in a substantially continuous layer on said nonconducting portions of said hold walls;

(d) microetching said metal layers of said printed wiring board to remove deposited carbon black therefrom; and (e) later electroplating a substantially continuous metal layer over the deposited carbon black layer on said nonconducting portions of hole walls, thereby electrically connecting said metal layers of said printed wiring board.

20. A process as defined in claim 19 wherein said liquid carbon black dispersion further comprises a sufficient amount of at least one alkaline hydroxide to raise the pH of said liquid dispersion in the range of 10 to 14.

21. A process as defined in claim 20 wherein said alkaline hydroxide is potassium hydroxide.

22. A process as defined in claim 21 wherein said liquid dispersion contains less than about 10% by weight solids constituents.

23. A process as defined in claim 19 wherein said conductive metal is copper.

24. A process as defined in claim 19 wherein said liquid dispersing medium is water.

* * * * *